United States Patent
Schwab et al.

(10) Patent No.: US 11,212,907 B2
(45) Date of Patent: Dec. 28, 2021

(54) PRINTED CIRCUIT BOARD ARRANGEMENT COMPRISING AN ELECTRICAL COMPONENT AND A HEAT SINK

(71) Applicant: ZF FRIEDRICHSHAFEN AG, Friedrichshafen (DE)

(72) Inventors: Manuel Schwab, Friedrichshafen (DE); Michael Kohr, Bodnegg (DE); Michael Bergier, Etzenricht (DE); Thomas Hofmann, Regensburg (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/462,029

(22) PCT Filed: Nov. 6, 2017

(86) PCT No.: PCT/EP2017/078276
§ 371 (c)(1),
(2) Date: May 17, 2019

(87) PCT Pub. No.: WO2018/091290
PCT Pub. Date: May 24, 2018

(65) Prior Publication Data
US 2019/0335576 A1 Oct. 31, 2019

(30) Foreign Application Priority Data
Nov. 17, 2016 (DE) ...................... 10 2016 222 631.2

(51) Int. Cl.
*H05K 1/00* (2006.01)
*H05K 1/02* (2006.01)
(Continued)

(52) U.S. Cl.
CPC ............ *H05K 1/021* (2013.01); *H05K 3/0061* (2013.01); *H05K 3/341* (2013.01); *H05K 2203/1131* (2013.01)

(58) Field of Classification Search
CPC ...... H05K 1/021; H05K 3/0061; H05K 3/341; H05K 2203/1131
(Continued)

(56) References Cited

U.S. PATENT DOCUMENTS

| 9,254,588 | B1* | 2/2016 | Chao | H05K 3/0047 |
| 2002/0086515 | A1* | 7/2002 | Fukuyama | H01L 21/4853 |
| | | | | 438/616 |
| 2004/0217466 | A1* | 11/2004 | Lin | H05K 3/284 |
| | | | | 257/706 |
| 2005/0207133 | A1* | 9/2005 | Pavier | H01L 24/82 |
| | | | | 361/761 |

(Continued)

FOREIGN PATENT DOCUMENTS

| DE | 19627543 A1 | 11/1997 |
| EP | 1858077 A2 | 11/2007 |

OTHER PUBLICATIONS

International Search Report and Written Opinion for PCT/EP2017/078276, dated Feb. 2, 2018.

*Primary Examiner* — Mandeep S Buttar
(74) *Attorney, Agent, or Firm* — Corwell & Moring LLP

(57) ABSTRACT

A circuit board assembly has a circuit board and an electrical component embedded in a cured plastic layer, as well as a heat sink for cooling the component. The component is placed with a first side on a surface of the circuit board facing the heat sink and in electrical contact with the circuit board, and is located in a window in the cured plastic layer. Moreover, the component is materially bonded to a surface of the heat sink facing the circuit board at a second side lying opposite the first side, in particular through soldering or sintering. The plastic layer is injected and cured between the surface of the circuit board and the surface of the heat sink. In the production process, the material is melted by the heat (Continued)

at the same time as the injection, such that the component is materially bonded to the heat sink.

7 Claims, 2 Drawing Sheets

(51) Int. Cl.
*H05K 3/00* (2006.01)
*H05K 3/34* (2006.01)

(58) Field of Classification Search
USPC .......... 361/709, 749, 704, 679.54, 720, 715; 29/846, 829, 830, 838, 840, 883, 603.04, 29/603.06, 855, 893.33; 257/E21.499, 257/706
See application file for complete search history.

(56) References Cited

U.S. PATENT DOCUMENTS

| | | | |
|---|---|---|---|
| 2006/0120058 A1* | 6/2006 | Fairchild | H01L 23/13 361/761 |
| 2007/0023488 A1* | 2/2007 | Lawlyes | H01L 21/563 228/180.22 |
| 2007/0230115 A1* | 10/2007 | Dobritz | H01L 23/3675 361/688 |
| 2010/0142155 A1* | 6/2010 | Mertol | H01L 23/367 361/719 |
| 2011/0074020 A1* | 3/2011 | Yamakami | H01L 24/16 257/737 |
| 2013/0180763 A1 | 7/2013 | Moul et al. | |
| 2015/0036292 A1* | 2/2015 | Rai | H05K 1/0204 361/692 |
| 2016/0172267 A1* | 6/2016 | Maier | H01L 23/50 257/713 |

* cited by examiner

PRINTED CIRCUIT BOARD ARRANGEMENT COMPRISING AN ELECTRICAL COMPONENT AND A HEAT SINK

This application claims the benefit under 35 U.S.C. § 371 of the filing date of International Patent Application No. PCT/EP2017/078276, having an international filing date of Nov. 6, 2017, which claims priority to German Application No. 10 2016 222 631.2, filed Nov. 17, 2016, the contents of both of which are incorporated herein by reference in their entirety.

The invention relates to a circuit board assembly, an inverter and a method for producing the circuit board assembly.

A circuit board, e.g. a PCB, is normally constructed in a sandwich architecture. Conductive copper layers alternate with electrically insulated plastic layers in this structure. These plastic layers normally have an epoxy resin base.

Electrical components are normally located on both outer surfaces of the circuit board and in contact therewith. There is a relatively high amount of heat in some of these components in the power electronics, e.g. power switches. This must be discharged via cooling surfaces of the components and potentially via an extra heat sink for the components, in order to prevent the components from overheating.

There is frequently a gap between an electrical component and its dedicated heat sink due to tolerances, that acts as a thermal insulation. This is filled with a thermal interface material (TIM) in order to improve the thermal conductance. Examples of TIMs are thermally conductive pastes, adhesives or pads. TIMs are normally electrically insulated, in order to electrically insulate the circuit board and the electrical components from the heat sink. For this reason, the circuit board or the components thereon must be attached to the heat sink with an additional mechanical connection, e.g. screws, clamps or brackets.

It is known that a circuit board populated with electrical components can be attached to a heat sink by means of a pre-preg layer in an injection process. As a result, the components are attached with a relatively small spacing to the heat sink, wherein the components adhere to the heat sink via the pre-preg layer. As a result, additional mechanical connections are superfluous. With this solution, the components are not, however, optimally connected to the heat sink, due to the poor thermal conductivity of the pre-preg layer.

A multi-layer circuit board assembly (multi-layer substrate) is known from DE 196 27 543 A1, in which the electrical components are located in windows in plastic spacing frames. The various layers of the circuit board assembly are connected to one another in a laminar manner through the use of a resin in an injection process. In this case, there is no heat sink for the electrical components in the circuit board assembly. Accordingly, the heat discharge from the components is not optimal.

The object of the invention is to improve on the prior art.

This object is achieved with the features of the subject matter of the independent claim. Preferred embodiments thereof can be derived from the dependent claims. Accordingly, a circuit board assembly and an inverter are proposed, and a method for producing a circuit board assembly is proposed.

The circuit board assembly has at least one circuit board and an electrical component embedded in a cured plastic layer, as well as a heat sink for cooling the component. The component is placed with a first surface (undersurface) on a surface of the circuit board facing the heat sink. The component is also in electrical contact with the circuit board. Moreover, the component is in a window in a plastic layer. The component is also materially bonded at a second surface (upper surface) lying opposite the first surface to a surface of the heat sink facing the circuit board, in particular through soldering or sintering. The plastic layer is injected between the surface of the circuit board and the surface of the heat sink, and cured.

The component is in electrical contact with electrical lines on or in the circuit board. The window in the plastic layer forms a hole passing through the plastic layer. The component is located therein. The plastic layer encompasses the component, in particular at the sides. The component is thus encompassed laterally by the cured plastic, and by the circuit board at its undersurface, and material forming a material bonded connection at its upper surface, in particular solder or sintering material (in particular sintered metal), or the heat sink soldered thereto.

The electrical component can be an SMD component (surface-mounted device). The electrical component can be an electrical resistor, a coil, inductor, or a condenser or capacitor. The electrical component can also be an electrical logic component (flip-flop, etc.), or an integrated circuit or an electrical switch. In particular, the electrical component is a power semiconductor switch, e.g. an IGBT (insulated-gate bipolar transistor) or MOSFET (metal-oxide—semiconductor field-effect transistor).

The circuit board can be a PCB (printed circuit board). The circuit board can also be a ceramic substrate with conductor paths located thereon. The circuit board can be populated on one side with the one or more electrical components, i.e. the components are all located on one side of the circuit board, wherein this side is then the side facing the heat sink. Alternatively, the circuit board can also be populated on both sides with electrical components. The circuit board then has not only the aforementioned electrical component, which is located in the window in the plastic layer and is soldered to the heat sink, but also one or more further electrical components, which is/are located on a side of the circuit board lying opposite that on which the aforementioned component is located.

The plastic layer is a curable plastic frame, in particular comprising the window(s) for the electrical component(s). The plastic layer can thus also be referred to as a plastic frame. In particular, the plastic layer is also in the form of a frame when it is not cured, and is thus not in liquid form. In particular, the plastic layer is a pre-preg, thus a fiberboard that is pre-impregnated with resin. The window(s) can be pre-formed therein, e.g. cut or stamped out, as is illustrated at step 206 in FIG. 2. The plastic layer ensures a secure connection between the circuit board and the heat sink. For this, it adheres thereto, or they are glued to one another. The circuit board thus forms a mechanically secure unit. Other connecting means for mechanically connecting the circuit board to the heat sink, e.g. screws or rivet or clamps are thus unnecessary, or can be eliminated. Gaps between the electrical components and the dedicated windows in the plastic layer can be filled with a filler material, e.g. resin.

The plastic layer can thus be made of a thermoset pre-filled with filler material, preferably epoxy resin. The plastic layer is distinguished in particular in that it has the same or similar properties as the plastic used in the sandwich architecture of the circuit board. One of these properties is that the plastic adheres to metallic substances, preferably copper or aluminum. A further property is a good thermal conductance.

The heat sink can have an extra cooling structure, in particular, such as cooling fins and/or lines for conducting coolant. The heat sink has a larger surface area on its surface facing the components than the component or the dedicated window in the plastic layer. The heat sink can thus be soldered to this surface together with numerous electrical components located on the circuit board, which are provided with a window (in particular one for each) in the plastic layer.

The plastic layer is preferably the same height as the component and the material layer that forms the material bonded connection with the heat sink, e.g. a solder layer or a sintered metal layer. As a result, the heat sink can bear in a planer manner on the plastic layer and also be materially bonded to the surface of the component. Heat can thus be discharged through the plastic layer.

The second side (upper surface) of the component, thus the side facing the heat sink, can be materially bonded to the heat sink over the entire surface area. As a result, heat can be discharged particularly well from the component. For this, the second side, or upper surface is preferably planar.

As shown in FIG. 2, a method for producing such a circuit board provides that the plastic layer is injected and then cured between the circuit board and the heat sink while heated in a production step, and the material for the material bonding, in particular soldering or sintering material, melts between the electrical component and the heat sink when heated, such that the compound is materially bonded to the heat sink (at step 214).

As shown in FIG. 2, the method for producing such a circuit board assembly comprises at least the following steps in particular:
1. Providing a circuit board with at least one electrical component located on a surface of the circuit board and in electrical contact with the circuit board (202);
2. Providing a curable plastic layer with a window for the component (204 and 206), in particular on the surface of the circuit board or on a side of the heat sink facing the circuit board in the assembled circuit board assembly (208);
3. Applying material for a materially bonded connection of the component to the heat sink, in particular on a side of the component facing the heat sink in the assembled circuit board assembly, or at a location on the heat sink corresponding to the component in the assembled circuit board assembly (210);
4. Placing the heat sink on the component such that the plastic layer and the component are placed, together with the material for the materially bonded connection, between the circuit board and the heat sink, and the component is located inside the window (212);
5. Injecting and curing the plastic layer between the circuit board and the heat sink while heated, such that the material for the materially bonded connection melts, and the component is materially bonded to the heat sink (214).

Accordingly, the circuit board is thus pre-populated with the electrical component. Numerous such electrical components can also be used, as explained above.

The temporal sequence of the steps in the production of the circuit board assembly can follow this sequence exactly (from top to bottom, or from step 1 to step 5, e.g., steps 202-214 in FIG. 2). The sequence of the steps can also be altered, if this is beneficial, e.g. steps 2 and 3 can be reversed. Some of the steps can also take place simultaneously, e.g. the plastic layer can be placed on the circuit board (step 2) when the material for the materially bonded connection is applied to the heat sink (step 3).

As is shown in FIG. 2 at step 216, the heat sink is preferably releasably mounted on a compression mold for the injection of the plastic layer. The heat sink can thus be securely mounted on the compression mold during step 5. After the injection, the heat sink can then be simply removed from the compression mold. The position of the heat sink in the circuit board assembly can thus be securely maintained.

The compression mold preferably has a heater for melting the material for the materially bonded connection, as is shown at step 218 in FIG. 2. A separate tool is then no longer needed for melting this material. In the melted state, the material for the materially bonded connection can be in the form of a paste, in particular a soldering paste, or a powder, in particular a sintering powder.

The injection and curing step (step 5) preferably takes place at low pressure, or in a vacuum, as is shown at step 220 in FIG. 2. The components of the circuit board assembly are thus in a partial vacuum during step 5. As a result, air or processing gas, e.g. released through the melting of the material for the materially bonded connection, or the soldering or sintering material, from the window in the plastic layer and in particular between the component and the heat sink, can be substantially removed. The materially bonded connection thus has very few shrinkage cavities or other enclosures, and is thus reliable and provides for a good thermal conductance. The low pressure refers to an atmospheric pressure that is lower than an atmospheric ambient air pressure. In order for step 5 to be able to be carried out at a low pressure, the relevant parts of the circuit board are placed in a (low) pressure container, in which a reduced pressure (low pressure), in comparison with an external ambient air pressure, is generated and maintained for step 5.

The circuit board can form a so-called power module. Such a power module forms a separate structural unit. The power module can form an electrical half-bridge. A power module in the form of a half-bridge has a phase connection, in particular, located electrically between a first electrical component in the form of a high-side switch and a second electrical component in the form of a low-side switch, and connections for activating the high-side and low-side switches. The components are located in the described manner between the circuit board and the heat sink in a (collective or individual) window in the cured plastic layer, and soldered in each case to the heat sink.

The one or more proposed circuit board assemblies, or one or more power modules, can form an inverter. Such an inverter can also be referred to as a DC-AC converter. It is configured to convert a direct current (DC) to a (quasi) alternating current (AC). Conversely, it can also be configured to convert an alternating current to a direct current.

A proposed motor vehicle drive system has an electric machine in the form of a traction drive, thus for providing a drive torque, and it has such an inverter for operating the electric machine. The inverter thus supplies the electric machine with the electrical current necessary for operating the electric machine, in particular a (quasi) alternating current. The electric machine can be an induction machine in particular, e.g. a synchronous machine or an asynchronous machine.

The invention shall be explained in greater detail below based on drawings from which further preferred embodiments of the invention can be derived.

Figure 1:
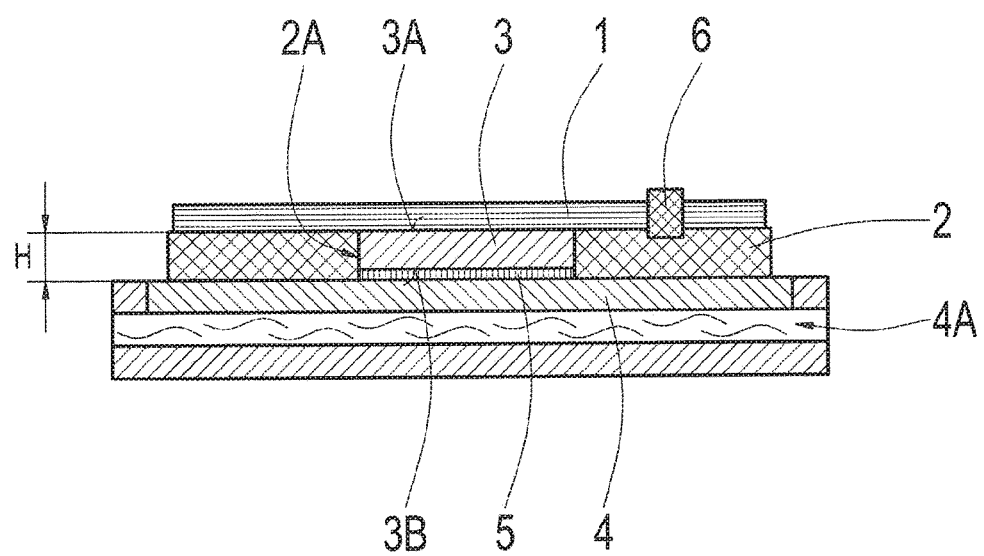
FIG. 1 shows a schematic drawing of a circuit board assembly.

With reference to FIG. 1, the circuit board assembly has a circuit board 1, and an electrical component 3 embedded in a cured plastic layer 2. The circuit board assembly also has a heat sink 4 for cooling the component 3. As shown in FIG. 1, the heat sink can have at least one cooling channel 4A, through which coolant is conducted for cooling the component 3 or the circuit board 1. Alternatively or additionally, cooling fins or other cooling structures, e.g. so-called fin-pins, can be provided on the heat sink 4. There can be further electrical components 6 on or in the circuit board 1. The circuit board 1 can thus be populated and in contact with electrical components 3, 6 on both sides, for example.

The electrical component 3 is placed with a first flat side (undersurface) on a surface of the circuit board 1 facing the heat sink, and is in electrical contact with the circuit board 1. For this, the circuit board 1 can have conductor paths running on the surface and/or in the circuit board 1. The component 3 is located in a window 2A in the cured plastic layer 2. The window 2A forms a cut-out, thus a through hole, in the plastic layer 2. It can be formed in any suitable manner, e.g. through stamping or cutting. One or more electrical components 3 can be located inside the window 2A, as shown.

The component 3 is also materially bonded to a surface of the heat sink 4 facing the circuit board at a second surface 3B (upper surface) lying opposite the first surface 3A. A soldered connection is preferably selected as the materially bonded connection. A sintered connection can likewise be used. For the soldering, a solder layer 5 is provided between the component 3 and the heat sink 4. The solder layer 5 connects the component to the heat sink in a materially bonded manner. The plastic layer 2 is injected and cured between this surface of the circuit board 1 and this surface of the heat sink 4. It thus adheres to the heat sink 4 and the circuit board 1 on each side, mechanically connecting them.

The plastic layer 2 is the same height as the component 3 together with the solder layer 5 for soldering it to the heat sink 4. As a result, the plastic layer 2 and the component 3 lie flat on the solder layer 5, at the same level as the heat sink 4. The solder layer 5 connects the component 3 at its upper surface 3B to the heat sink 4 over the entire surface of the component.

The circuit board assembly according to FIG. 1 is used in particular in an inverter. The electrical component 3 can be a semiconductor switch in this case, e.g. a high-side or low-side switch in a bridge circuit of the inverter.

Figure 2:
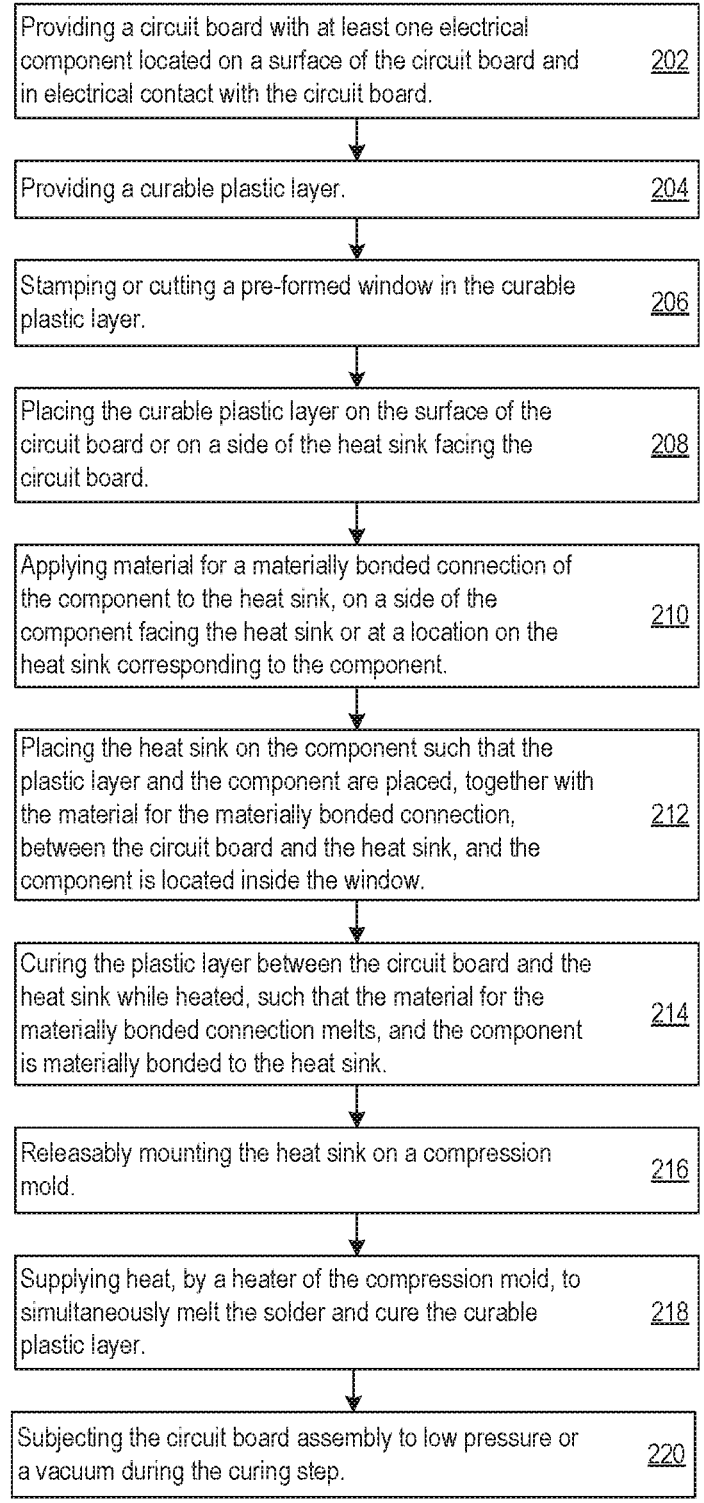
FIG. 2 shows a flow diagram of a method of producing a circuit board assembly, according to various embodiments.

FIG. 2 illustrates a preferred production process for producing the circuit board assembly shown in FIG. 1, wherein the plastic layer 2 is injected and cured between the circuit board 1 and the heat sink 4 while heated (at step 214). At the same time, the solder 5, or solder paste that has already been inserted between the electrical component 3 and the heat sink 4 is melted by the heat, such that the component 3 is soldered to the heat sink 4 (also at step 214). The solder 5 simultaneously bridges a gap between the component 3 and the heat sink 4 caused by tolerances. As a result, a good heat transfer from the component 3 to the heat sink 4 can be obtained.

It is preferably provided that the heat sink 4 is releasably located on a compression mold prior to injecting the plastic layer 2, which is used for pressing the heat sink 4 onto the plastic layer 2, or the circuit board 1 (step 216). After the injection and curing, this connection between the heat sink 4 and the compression mold is released, and the heat sink is removed therefrom with the circuit board assembly.

The compression mold preferably also has a heater that supplies heat during the injection, and simultaneously melts the solder (at step 218). The injection takes place in particular at low pressure so that gases or air can be removed from the solder 5 and the plastic layer 2 (at step 220).

By way of example, and with reference to FIG. 2, the production process takes place as follows:

When the plastic layer (provided at step 204) is applied to the circuit board 1 populated on one or both sides with electronic components 3 (circuit board 1 provided at step 202), the not yet cured plastic for the plastic layer 2 is placed on the circuit board 1 in the form of a film or plate (at step 208). At this point, or previously, windows 2A are cut into the plastic at the locations of the components 3 that are to be cooled (at step 206). Solder 5 is applied to the components 3 that are to be cooled in the windows 2A (at step 210). The heat sink 4 is subsequently placed on the plastic layer 2 and the solder 5 (at step 212).

At this point, the air between the circuit board 1, the electronic components 3, the plastic layer 2 and the heat sink is removed by means of a vacuum (at step 220). At the same time, or subsequently, the plastic layer 2 is pressed onto the circuit board 1 with the solder 5. The viscosity of the plastic layer 2 is lower at this point, and the plastic flows into the existing spaces between the circuit board 1 and the electrical components 3. In this step, the compression mold is remains closed until the relatively low viscosity plastic is forced or pressed to the side far enough that the spacing between the upper surface 3B of the component 3 and the compression mold or the heat sink 4 located thereon reaches a minimum. Heat is supplied during this step, melting the solder 5, and the locations/surfaces of the heat sink 4 corresponding to the components 3 are wetted therewith, thermally connecting them to one another (at step 214). When the desired spacing has been obtained, the compression mold is held in place. Because of the processing heat caused by the heat supply, and the existing pressure, the plastic in the plastic layer 2 hardens simultaneously. During the curing process of the plastic material and the solder 5 a materially bonded, full surface, and permanent connection is obtained between the circuit board 1 and the heat sink 4 (at step 214).

The proposed production process and/or the proposed circuit board assembly offer the following advantages:

Because of the minimal thickness of the solder 5 layer between the electronic components 3 and the heat sink 4, in combination with the high thermal conductance of the solder 5, a very good heat transfer is obtained between the components 3 and the heat sink 4. The circuit board 1 is also connected over its surface area to the heat sink 4 via the plastic layer 2, and thus has a good thermal bond thereto.

Because of the materially bonded, full surface and permanent connection between the circuit board 1 and the heat sink 4, mechanical connecting elements can be eliminated, entirely or in part. The necessary installation space is reduced. The attachment of additional TIMs for electrical insulation of electric elements or components of the circuit board 1 that are subjected to a current is eliminated. Assembly and production costs are reduced.

As a result of the full surface connection to the heat sink 4, the oscillation/vibration load to the circuit board 1 is also reduced, because mechanical tensions in the circuit board 1 resulting from otherwise necessary connecting elements no longer exist. This also results in greater reliability. The full surface, compact, and dense bond also prevents contamination.

The circuit board assembly disclosed herein is therefore particularly suitable for use in a motor vehicle, in particular an inverter in an electric motor vehicle drive system.

REFERENCE SYMBOLS 1 circuit board
2 plastic layer
2A window
3 electrical component
3A first location
3B second location
4 heat sink
4A cooling channel
5 solder layer, solder
6 electrical component
H height

The invention claimed is:

1. A method for producing a circuit board assembly, the method comprising:
   providing a circuit board comprising at least one electrical component located on a surface of the circuit board and in electrical contact with the circuit board;
   providing a non-liquid curable plastic frame;
   at least one of stamping or cutting a pre-formed window in the non-liquid curable plastic frame for the at least one electrical component;
   placing the non-liquid curable plastic frame on at least one of the surface of the circuit board or on one side of a heat sink after the pre-formed window is at least one of stamped or cut into the non-liquid curable plastic frame;
   applying a material layer to a side of the component facing the heat sink in the assembled circuit board assembly, or a location on the heat sink corresponding to the at least one electrical component in the assembled circuit board assembly, the material layer comprising at least one of a soldering material or a sintering material configured to form a materially bonded connection between the at least one electrical component and the heat sink;
   placing the heat sink on the at least one electrical component, such that the non-liquid curable plastic frame and the at least one electrical component, together with the material layer, are located between the circuit board and the heat sink, and the component is located inside the pre-formed window; and
   curing the plastic frame between the circuit board and the heat sink while heating, wherein the material layer is simultaneously melted by the heat to materially bond the at least one electrical component to the heat sink.

2. The method according to claim 1, further comprising releasably attaching the heat sink to a compression mold for the curing of the plastic frame.

3. The method according to claim 2, further comprising supplying heat to the circuit board assembly with a heater of the compression mold to simultaneously cure the plastic frame and melt the material layer.

4. The method according to claim 1, further comprising subjecting the circuit board assembly to low pressure while curing the plastic frame.

5. The method according to claim 1, wherein the plastic frame is the same height as the at least one electrical component together with the material layer.

6. The method according to claim 1, wherein the plastic frame comprises a pre-preg.

7. The method according to claim 1, further comprising applying the material layer such that the material layer contacts an entire surface of the side of the component facing the heat sink and materially bonds the entire surface of the second side of the component to the heat sink after heating.

* * * * *